United States Patent
Lee et al.

(10) Patent No.: US 7,352,630 B2
(45) Date of Patent: Apr. 1, 2008

(54) NON-VOLATILE MEMORY DEVICE HAVING IMPROVED PROGRAM SPEED AND ASSOCIATED PROGRAMMING METHOD

(75) Inventors: Chul-Ho Lee, Suwon-si (KR); Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/478,580

(22) Filed: Jul. 3, 2006

(65) Prior Publication Data
US 2007/0025159 A1   Feb. 1, 2007

(30) Foreign Application Priority Data
Jul. 26, 2005   (KR) ...................... 10-2005-0068039

(51) Int. Cl.
*G11C 11/34* (2006.01)
(52) U.S. Cl. .................. 365/185.22; 365/200
(58) Field of Classification Search ........... 365/185.22, 365/200
See application file for complete search history.

(56) References Cited

U.S. PATENT DOCUMENTS

| | | | |
|---|---|---|---|
| 6,046,939 A | 4/2000 | Noda et al. | |
| 6,608,784 B2 | 8/2003 | Kanamori et al. | |
| 7,158,416 B2 * | 1/2007 | Kern | 365/185.22 |
| 2004/0141377 A1 * | 7/2004 | Arai et al. | 365/185.22 |
| 2005/0190603 A1 * | 9/2005 | Lee et al. | 365/185.22 |
| 2007/0097749 A1 * | 5/2007 | Li et al. | 365/185.22 |
| 2007/0133298 A1 * | 6/2007 | Cernea | 365/185.22 |

FOREIGN PATENT DOCUMENTS

| | | |
|---|---|---|
| JP | 10-222995 | 8/1998 |
| JP | 2003-076615 | 3/2003 |
| JP | 2004-220068 | 8/2004 |
| JP | 2005-018983 | 1/2005 |
| KR | 1998-063711 | 10/1998 |

* cited by examiner

*Primary Examiner*—Michael T Tran
(74) *Attorney, Agent, or Firm*—Volentine & Whitt, PLLC (57) ABSTRACT

A non-volatile memory device comprises a memory cell array having a plurality of non-volatile memory cells arranged in rows and columns. Selected memory cells are programmed by applying program voltages thereto. Next, data bits stored in the selected cells are read. Then, a first column scan operation is performed to determine whether any of the selected memory cells is inadequately programmed. Upon determining that at least one of the selected memory cells is inadequately programmed, a second column scan operation is performed to detect a total number of the selected memory cells that are inadequately programmed. Upon determining that the total number of the selected memory cells that are inadequately programmed is less than a number that can be corrected by an error correcting circuit, the program operation terminates with a program pass status.

19 Claims, 5 Drawing Sheets

Fig. 1

(Prior Art)

NON-VOLATILE MEMORY DEVICE HAVING IMPROVED PROGRAM SPEED AND ASSOCIATED PROGRAMMING METHOD

BACKGROUND OF THE INVENTION

1. Field of the Invention

Embodiments of the present invention relate generally to semiconductor memory devices. More particularly, embodiments of the invention relate to non-volatile memory devices and associated programming methods.

A claim of priority is made to Korean Patent Application No. 2005-68039 filed on Jul. 26, 2005, the disclosure of which is hereby incorporated by reference in its entirety.

2. Description of Related Art

The demand for high performance non-volatile memory devices has increased dramatically in recent years. This increased demand is due at least in part to the proliferation of increasingly sophisticated portable electronic devices requiring high capacity, high speed memories capable of storing data even when power is cut off from the devices.

Flash memory is one of the most popular forms of non-volatile memory in use today. Flash memory is a popular choice for portable electronic devices for many reasons such as its non-volatile properties, its high capacity, high speed, low power consumption, shock resistance, ease of implementation, and low cost per bit. Common examples of portable devices that include flash memory are cellular phones, cameras, portable music players, memory sticks, and so on. Flash memory is also used in a variety of non-portable devices such as the BIOS of most personal computers.

Most flash memory falls roughly into one of two major categories: NAND flash memory and NOR flash memory. NAND flash memory is typically employed for long term data storage because of its relatively high density compared with NOR flash memory, while NOR flash memory is often used for storing data requiring quick access such as program code, due to its relatively high read speed compared to NAND flash memory.

Exemplary flash memory devices are disclosed in a variety of patent documents. For instance, U.S. Pat. Nos. 5,677,873 and 5,991,202 both disclose flash memory devices and associated programming methods.

Figure 1:
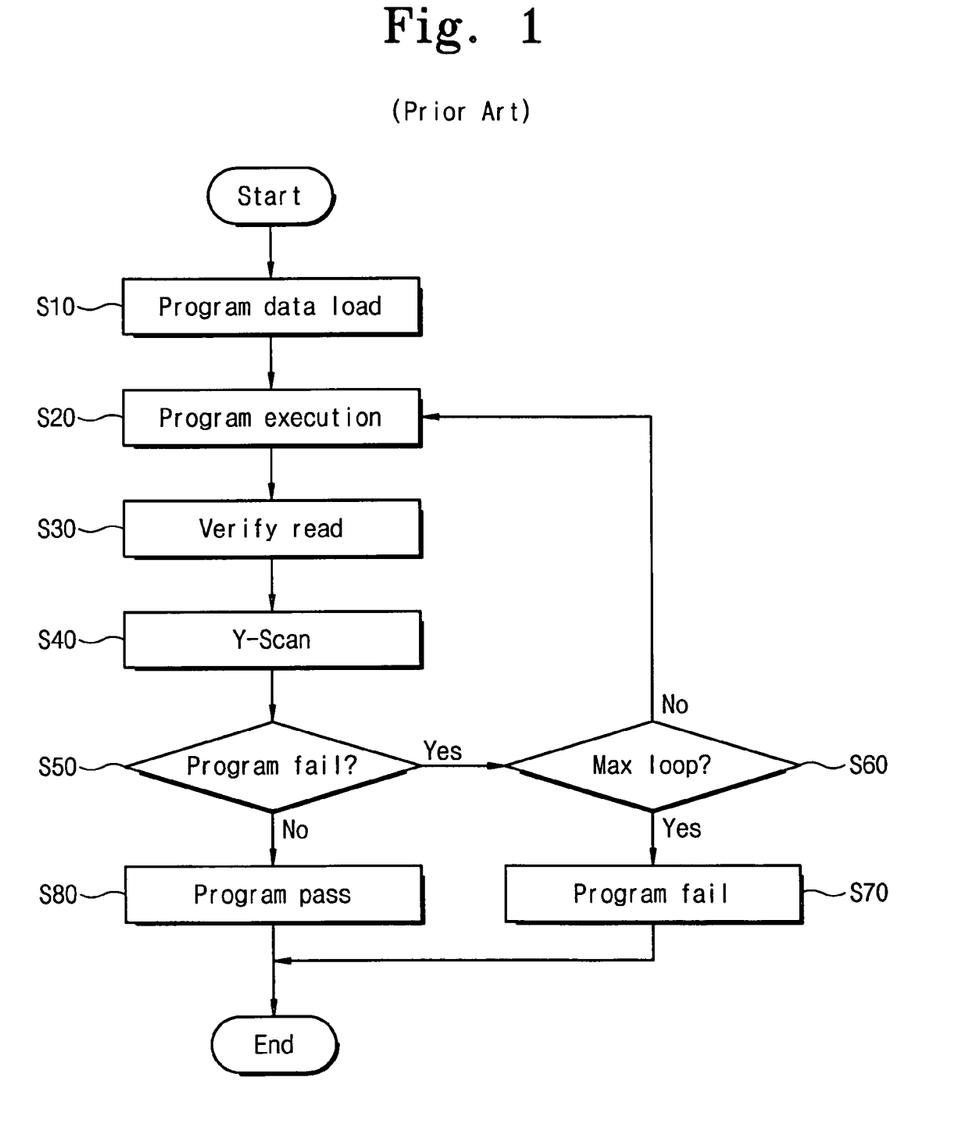
FIG. 1 is a flowchart illustrating a conventional method of programming a non-volatile memory device.

FIG. 1 is a flowchart illustrating a conventional method of programming a non-volatile memory device. The method is described below. In the description that follows, exemplary method steps are denoted by parentheses (XXX).

Referring to FIG. 1, program data is loaded into a first register of the non-volatile memory device (S10). Next, the program data loaded in the first register is programmed into a selected memory cell of the non-volatile memory device (S20). Thereafter, a verify read operation is performed to determine whether the selected memory cell has attained a desired threshold voltage or not (S30), and a result of the verify read operation is temporarily stored in a second register. The data stored in the second register is then selected and loaded into an internal data bus (S40). This operation is referred to as a column scan operation, or a Y-scan operation.

After the column scan operation, the data loaded in the internal data bus is inspected to determine whether it has a program pass value (S50). A program pass value is a data value that indicates that the selected memory cell has been adequately programmed. The opposite of the program pass value is a program fail value, which indicates that the selected memory cell has not been adequately programmed.

If the data loaded in the internal data bus has the program pass value (S80), then the programming of the memory cell is complete and the method terminates. Otherwise, the method determines whether a number of program loops performed on the selected memory cell has reached a predefined maximum number of loops allowed (S60). If the number of program loops performed on the selected memory cell reaches the maximum number allowed, then the programming of the selected memory cell has failed (S70) and the method terminates. Otherwise, steps S20 through S60 are repeated until either the maximum number of loops is reached, or the selected memory cell is properly programmed.

If the maximum number of program loops is reached and the selected memory cell is not programmed, then a block of the non-volatile memory device where the selected memory cell resides is classified as a bad block. In other words, if a bit fails to be adequately programmed after the maximum number of program loops, the block containing the bit is considered a bad block. A bit that fails to be adequately programmed after a programming operation is performed will be referred to hereafter as a "failed bit."

Memory blocks are classified as "bad blocks" regardless of the total number of failed bits contained therein. However, classifying a whole block as a bad block based on a single failed bit can be wasteful because often the presence of a small number of failed bits can be remedied by including an error correction circuit in the memory device. When a read operation is performed, the error correction circuit can ensure that a block which would otherwise be classified as a "bad block" will output the correct data values.

SUMMARY OF THE INVENTION

Selected embodiments of the invention address the above problems by providing non-volatile memory devices wherein a memory block can be classified as a "good block" as long as a number of failed bits in the block is less than a number of bits that can be corrected by an error correction circuit. In addition, selected embodiments of the invention allow programming speed to be improved by relaxing the requirement that all cells in each memory block must be entirely programmed.

According to one embodiment of the invention, a method of performing a program operation of a non-volatile memory device is provided. The method comprises (a) programming selected memory cells of the non-volatile memory device, (b) reading data bits from the selected memory cells, (c) performing a first column scan operation by sequentially selecting predetermined sub-units of the data bits and determining whether any of the selected memory cells is inadequately programmed based on the selected sub-units, (d) upon determining that at least one of the selected memory cells is inadequately programmed and before selecting all of the predetermined sub-units of the data bits in the first column scan operation, performing a second column scan operation to detect a total number of the selected memory cells that are inadequately programmed, and (e) upon determining that the total number of the selected memory cells that are inadequately programmed is less than a number that can be corrected by an error correcting circuit, terminating the program operation with a program pass status.

According to another embodiment of the invention, another method of programming a non-volatile memory device is provided. The method comprises (a) programming selected memory cells of the non-volatile memory device, (b) performing a verify read operation to read data bits from the selected memory cells after programming the selected memory cells, (c) performing a first column scan operation after performing the verify read operation to determine whether any of the selected memory cells is inadequately programmed, (d) upon determining that at least one of the selected memory cells is inadequately programmed, performing a second column scan operation to determine a total number of the selected memory cells that are inadequately programmed, and (e) upon determining that the total number of the selected memory cells that are inadequately programmed is less than a number that can be corrected by an error correcting circuit, terminating the program operation with a program pass status.

According to still another embodiment of the invention, a non-volatile memory device is provided. The non-volatile memory device comprises a memory cell array comprising a plurality of non-volatile memory cells arranged in rows and columns. The device further comprises a page buffer circuit for reading and storing data bits from a selected row of the memory cells in a verify read operation of a program operation, a column selection circuit for selecting predetermined units of the data bits from the page buffer circuit in response to a column address, a pass/fail check circuit for determining whether or not all of the memory cells in the selected row are adequately programmed based on the predetermined units of data bits selected by the column selection circuit in a first column scan operation, and a fail bit counter for counting a total number of memory cells in the selected row that are inadequately programmed in a second column scan operation. The device still further comprises a control logic circuit for activating the fail bit counter such that the second column scan operation is performed when at least one data bit selected by the column selection circuit in the first column scan operation indicates that a corresponding memory cell in the selected row is inadequately programmed. The control logic circuit terminates the program operation with a program pass status when the total number of inadequately programmed memory cells in the selected row, as determined by the second column scan operation, is less than a number that can be corrected by an error correcting circuit.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

In the description that follows, a NAND flash memory is used as an example of a non-volatile memory device to illustrate various characteristics and functions provided by certain aspects of the invention. However, those skilled in the art will understand that other types of non-volatile memories can be used without departing from the scope of the invention.

Figure 2:
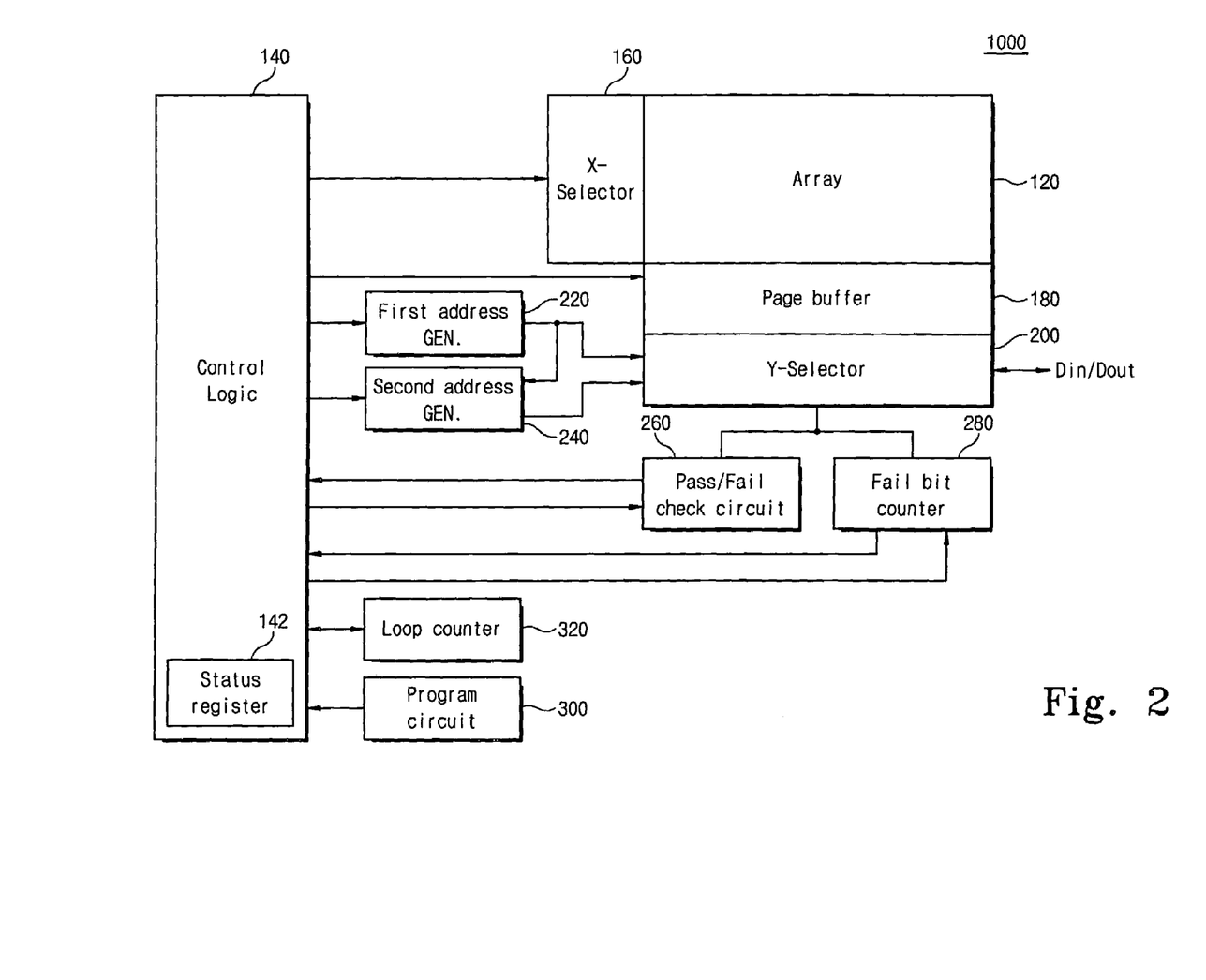
FIG. 2 is a block diagram of a non-volatile memory device according to an embodiment of the present invention.

FIG. 2 is a block diagram of a non-volatile memory device 1000 according to an embodiment of the present invention. Referring to FIG. 2, non-volatile memory device 1000 comprises a memory cell array 120 comprising a plurality of non-volatile memory cells arranged in a matrix and connected to corresponding wordlines and bitlines arranged in rows and columns, respectively. The memory cells are typically arranged in a NAND structure or a NOR structure; however, for explanation purposes it will be assumed that the memory cells are arranged in a NAND structure.

Non-volatile memory device 1000 further comprises a control logic circuit 140, a row selection circuit 160, a page buffer 180, a column selection circuit 200, a first address generator 220, a second address generator 240, a pass/fail check circuit 260, a fail bit counter 280, a program circuit 300, and a loop counter 320.

Control logic circuit 140 is configured to control the overall operation of non-volatile memory device 1000. The following description provides an explanation of how control logic circuit 140 can control program operations of non-volatile memory device 1000. However, control logic circuit 140 can also control other aspects of non-volatile memory device 1000, such as read, erase, and test operations. Control logic circuit 140 includes a status register 142 in which program status information such as program fail information and program pass information is stored. The information stored in status register 142 is output from non-volatile memory device 1000 in response to a command such as a status read command.

In general, program operations are performed by selecting a set of memory cells in memory cell array 120 through the operation of column selection circuit 200 and row selection circuit 160. One or more program loops are then performed on the selected memory cells, wherein a program loop includes applying program voltages to the selected memory cells and then checking whether the selected cells have been adequately programmed. If it is determined that a sufficient number of the selected memory cells have been adequately programmed, the program operation terminates. Otherwise, more program loops are performed until a sufficient number of the selected memory cells are programmed or a maximum number of program loops is reached. A sufficient number of memory cells are considered to be programmed if the number of failed bits is sufficiently low compared to the total number of bits being programmed, such that an error correction circuit can recover all of the bits being programmed despite the failed bits.

To determine whether a sufficient number of selected memory cells are adequately programmed, each programming loop typically includes a first column scan operation used to determine whether any bits failed to be programmed correctly. Where the first column scan operation determines that one or more bits failed to be programmed correctly, a second column scan operation is used to determine the total number of bits that failed to be programmed correctly.

More particular descriptions of the operations performed by various components of non-volatile memory device 1000 are provided below.

Control logic circuit 140 controls row selection circuit 160 to select rows of memory cell array 120 based on a row address. Page buffer circuit 180 operates as a sense amplifier or a write driver according to an operational mode of non-volatile memory device 1000. For instance, in a read operation, page buffer circuit 180 reads data from memory cell array 120 and temporarily stores the read data. In a program operation, page buffer circuit 180 temporarily stores input data received through column selection circuit 200, and drives selected bit lines with a bit line bias voltage according to the stored input data.

Control logic circuit 140 also controls first and second address generation circuits 220 and 240. First address generation circuit 220 generates a first column address during a first column scan operation. Second address generation circuit 240 then generates a second column address during a second column scan operation using the output of first address generation circuit 220, i.e., the current value of the first column address. The first column scan operation is typically performed to determine whether an entire set memory cells have been adequately programmed. If any of the set of memory cells is not adequately programmed, the second column scan operation is then performed to determine the number of memory cells that were inadequately programmed.

In the first column scan operation, column selection circuit 200 selects predetermined units of data stored in page buffer circuit 180 in response to the first column address. In the second column scan operation, column selection circuit 200 selects predetermined units of data stored in page buffer circuit 180 in response to the second column address. The first unit of data selected in the second column scan operation is the last unit of data selected in the first column scan operation. In other words, the first column scan operation examines data to detect any failed bits. Once a failed bit in the first column scan operation, the first column scan operation terminates. Then, if a second column scan operation is required to count the total number of failed bits, the column scan operation begins at the address where the first column scan operation left off. In this way, the first and second column scan operations avoid inspecting the same set of bits more than once, thus conserving the amount of time it takes to perform the program operation.

Control logic circuit 140 also controls pass/fail check circuit 260. Pass/fail check circuit checks whether or not the data selected by column selection circuit 200 in first column scan operation all has the same value, e.g., the program pass value, and then generates a check result indicative of the same. The check result is transferred to control logic circuit 140.

Fail bit counter 280, which is also controlled by control logic circuit 140, counts the number of failed bits among data selected by column selection circuit 200 in the second column scan operation. The number of bits counted by fail bit counter 280 is then transferred to the control logic circuit 140.

Loop counter circuit 320 is controlled by control logic circuit 140 to count a number of program loops performed in a programming operation of selected memory cells in memory cell array 120. Program circuit 300 stores a predetermined maximum number of program loops to be performed on the selected memory cells under the control of control logic circuit 140. Accordingly, control logic circuit 140 refers to program circuit 300 during program operations to ensure that the number of loops in each program operation does not exceed the maximum number.

Where the first column scan operation of a program loop determines that one or more bits failed to be properly programmed, a second column scan operation is then performed. That is, each of program loop includes the first column scan operation and include the second column scan operation. In the second column scan operation, the number of failed bits number is counted. Where the number of failed bits is less than or equal to a predetermined number that can be corrected by the error correcting circuit, the program loop is determined to "pass" and the program operation is completed.

By using the above technique to perform program operations in a non-volatile memory device, it is possible to enhance the program speed and also prevent relatively small numbers of failed bits from causing entire memory blocks from being classified as bad blocks. In addition, the above technique also allows the maximum number of program loops to be controlled by inputting the maximum number into program circuit 300.

Figure 3:
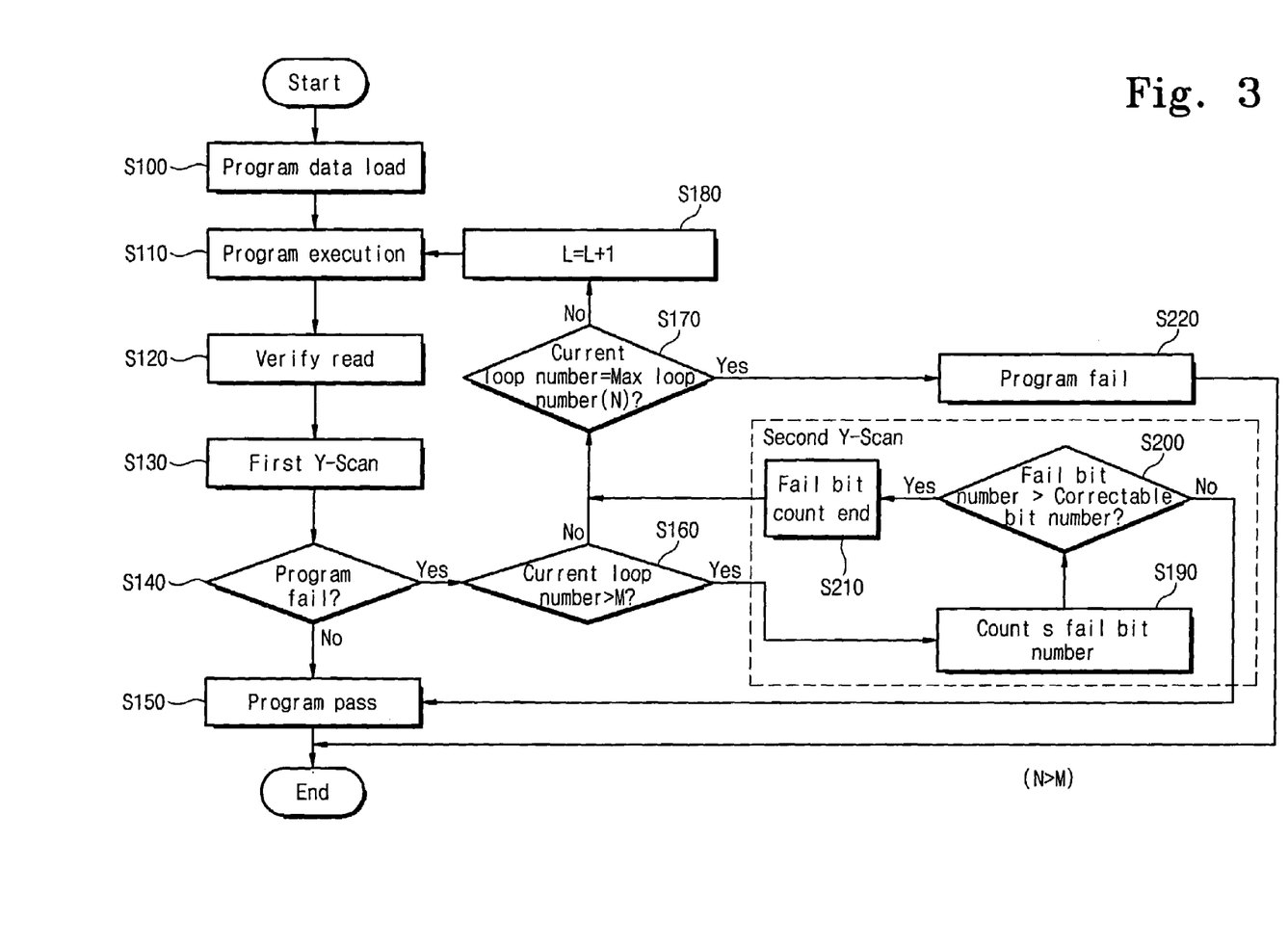
FIG. 3 is a flowchart illustrating a method of programming the non-volatile memory device illustrated in FIG. 2.

FIG. 3 is a flowchart illustrating a program operation of non-volatile memory device 1000 in further detail.

Referring to FIG. 3, non-volatile memory device 100 first enters a program operation mode. In the program operation mode, program data is loaded into page buffer circuit 180 through column selection circuit 200 (S100). Page buffer circuit 180 typically comprises a plurality of page buffers respectively corresponding to selected bit lines. Column selection circuit 200 selects the page buffers in predetermined units, e.g., 8, 16, or 32, in response to a column address output by first address generation circuit 220. Page buffer circuit 180 then transfers the program data to the selected page buffers.

Once the program data is loaded into the selected page buffers, memory cells in a row selected by row selection circuit 160 are programmed under the control of control logic circuit 140 (S110). The program operation is executed through a plurality of program loops, wherein each program loop has a program section and a verify section. In particular, the first and second column scan operations are successively performed during the verify section.

Once the program section of a program loop is executed, a verify read operation is performed under the control of control logic circuit 140 (S120). In the verify read operation, memory cells that were programmed in the program section are read out by page buffer circuit 180. Then, the first column scan operation is performed (S130).

In the first column scan operation, the page buffers of page buffer circuit 180 are sequentially selected in predetermined units by column selection circuit 200 based on the column address output by first address generation circuit 220. Data bits stored in the selected page buffers are transferred to pass/fail check circuit 260 through column selection circuit 200.

Pass/fail check circuit 260 checks whether or not the data bits have the program pass value (S140) and outputs a corresponding check result to control logic circuit 140. Where all of the data bits input to pass/fail check circuit 260 have the program pass value, other page buffers are selected and pass/fail check circuit 260 determines whether data bits stored in the other selected page buffers have the program pass value. In other words, as long as all of the data bits in the selected page buffers have the program pass value, column selection circuit 200 continues to sequentially select the data bits in page buffer circuit 180 based on the column address output by first address generation circuit 220 and pass/fail check circuit 260 checks the selected data bits until all of the data bits stored in page buffer circuit 180 have been checked. Accordingly, if the column scan operation is performed until all of the page buffers have been selected, and all of the data bits are detected to have the program pass value, then a data value indicating a successful program operation is stored in status register 142 and the program operation is completed.

However, if one or more bits of data in page buffer circuit 180 is detected to have the program fail value, pass/fail check circuit 260 outputs program fail information to control logic circuit 140. In response to the program fail information, control logic circuit 140 causes the first column scan operation to stop. In other words, when control logic circuit 140 receives the program fail information, it causes first address generation circuit 220 to stop outputting the column address to select data in page buffer circuit 180. Thereafter, control logic circuit 140 determines whether or not a current program loop number recorded in loop counter circuit 320 is greater than a reference value M (S160). If the current program loop number is less than reference value M, an operation S170 is performed.

In operation S170, control logic circuit 140 determines whether or not the current program loop number is equal to a maximum program loop number N of program circuit 300. If the current program loop number is less than maximum program loop number N, control logic circuit 140 controls loop counter circuit 320 to increase the program loop number by 1 (S180) and the program operation returns to operation S110.

Reference value M denotes a first predetermined program loop number which is less than or equal to maximum program loop number N. If the current program loop number is greater than reference value M, control logic circuit 140 performs the second column scan operation to calculate the number of failed bits among the data bits stored in the page buffers of page buffer circuit 180. Where the first column scan operation is stopped and the current program loop number is larger than reference value M, control logic circuit 140 controls first and second address generation circuits 220 and 240 such that the column address output by first address generation circuit 220 is transferred to second address generation circuit 240. Second address generation circuit 240 sequentially generates a series of column addresses as a start address based on the column address output by first address generation circuit 220.

In the second column scan operation, the first unit of data to be selected is the last unit of data that was selected by column selection circuit 200 in the first column scan operation. Column selection circuit 200 sequentially selects predetermined units of data from the page buffers in page buffer circuit 180 in response to the column address of second address generation circuit 240. Data bits from the selected page buffers are transferred to fail bit counter 280 through column selection circuit 200. Fail bit counter 280 counts the number of failed bits among the data bits received therein during the second column scan operation (S190). Fail bit counter 280 performs the counting as it receives the successive units of data from the selected page buffers. The number of failed bits counted by fail bit counter 280 in the second column scan operation is transferred to control logic circuit 140. Control logic circuit 140 determines whether or not the number of failed bits provided by fail bit counter 280 is greater than a number of failed bits that can be corrected by an error correcting circuit (S200).

If the number of failed bits counted by fail bit counter 280 is less than or equal to a number of failed bits that can be corrected by the error correcting circuit, control logic circuit 140 stores program pass information from pass/fail check circuit 260 in status register 142 (S150), and the program operation is completed. However, if the number of failed bits counted by fail bit counter 280 in the second column scan operation is greater than the number of failed bits that can be corrected by the error correcting circuit, control logic circuit 140 causes the second column scan operation to terminate (S210). In other words, control logic circuit 140 stops second address generation circuit 240 from generating addresses and also stops counter circuit 280 from counting the number of failed bits.

Following operation S210, the program operation proceeds to operation S170. In operation S170, control logic circuit 140 determines whether or not the number of the current program loop has reached maximum program loop number N of program circuit 300. If the number of the current program loop has reached maximum program loop number N of program circuit 300, control logic circuit 140 stores program fail information in status register 142 to indicate that the program operation failed, and the program operation terminates. If the number of the current program loop is less than maximum program loop number N, the program operation continues to operation S180. Thereafter, the program loops are repeated as described above.

As explained above, the program operation illustrated in FIG. 3 can be successfully completed as long as the number of failed bits among those programmed is less than or equal to the number of bits that can be corrected by the error correcting circuit. In general, these failed bits may be programmed by performing further program loops within the allowed maximum program loop number. However, since the program operation is finished when the number of existing failed bits is less than or equal to the number of bits that can be corrected by the error correcting circuit, the further program loops are unnecessary. If the further program loops are avoided, the amount of time required to program selected memory cells can be reduced relative to conventional programming methods such as that illustrated in FIG. 1. In the conventional programming method illustrated in FIG. 1, the program operation continues even when the number of failed bits is less than the number of bits that can be corrected by the error correcting circuit.

Figure 4A:
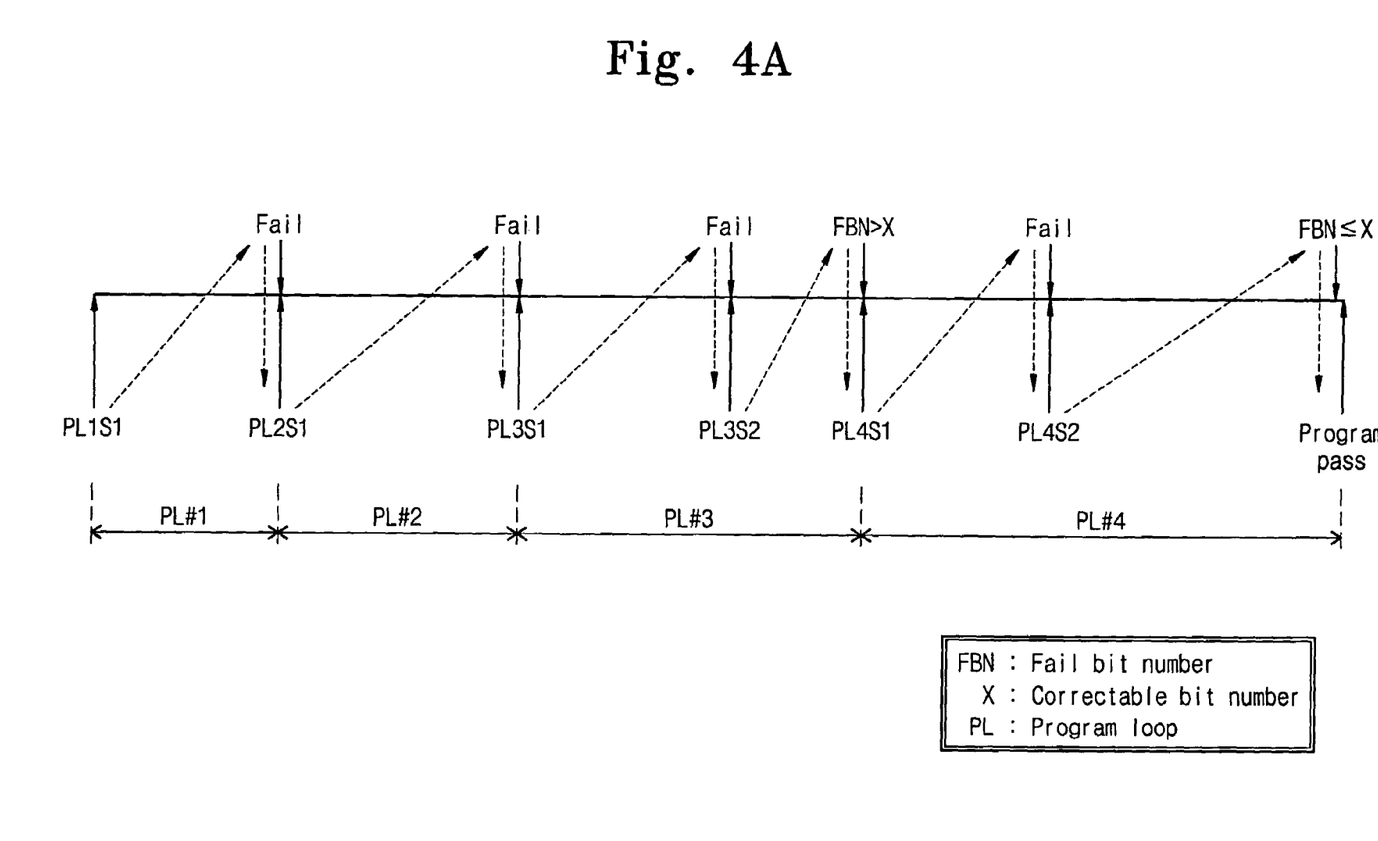
FIG. 4A is a conceptual diagram illustrating a program operation of a non-volatile memory device according to an embodiment of the present invention; and, FIG. 4B is a conceptual diagram illustrating a conventional program operation of a non-volatile memory device.
Figure 4B:
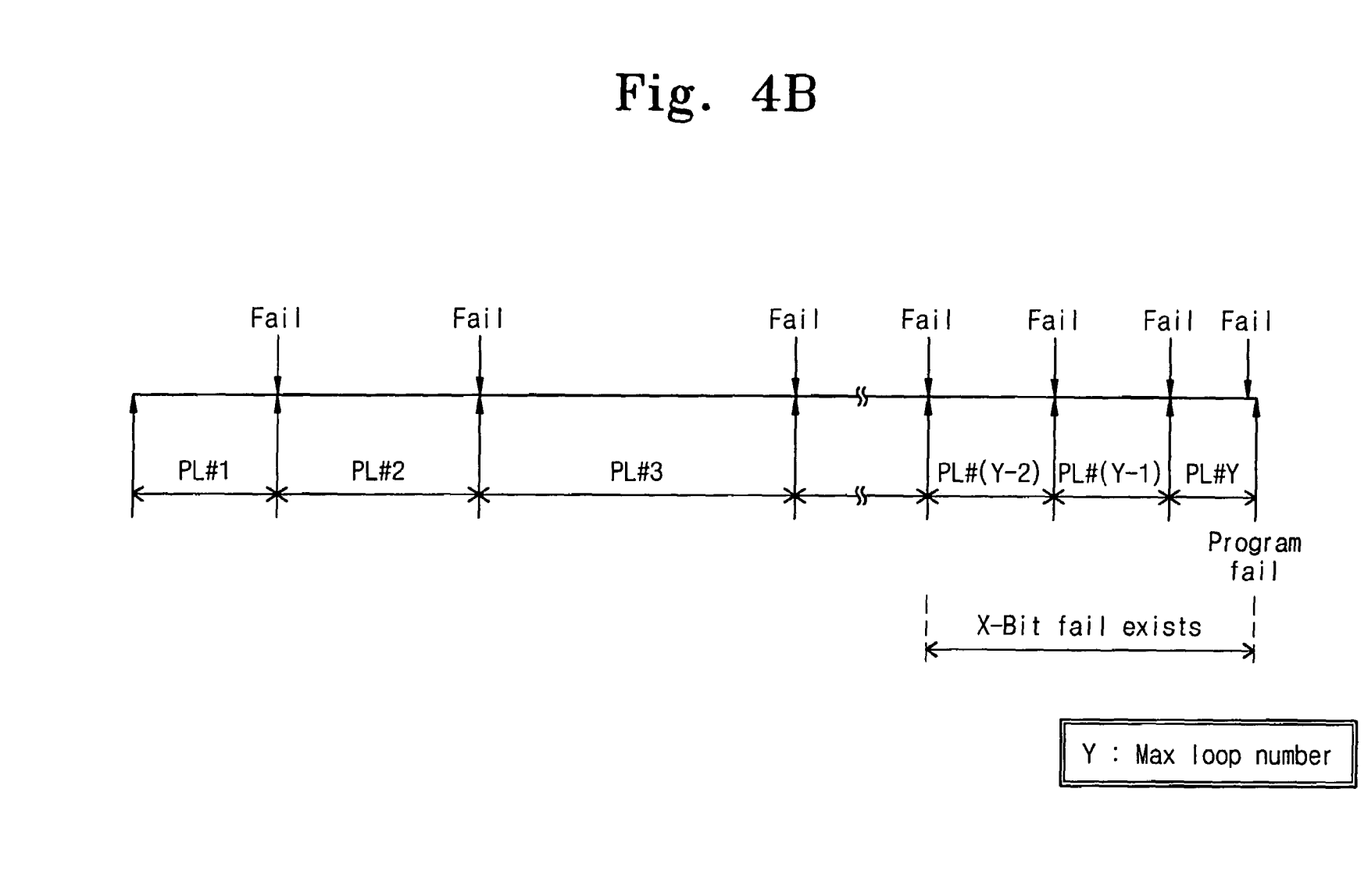

FIGS. 4A and 4B are conceptual diagrams illustrating a comparison between a program operation performed according to one embodiment of the invention and a conventional program operation. In particular, FIG. 4A illustrates a program operation performed according to an embodiment of the present invention and FIG. 4B illustrates a conventional program operation.

Referring to FIG. 4A, a predetermined number of program loops are performed without the second column scan operation. In this example, the number of program loops performed without the second column scan operation is two (2), i.e., PL#1 and PL#2. In other words, in FIG. 4A, reference number M=2. A second column scan operation PL3S2 performed in a third program loop PL#3 then determines that the number of failed bits (FBN) is greater than the number of bits that can be corrected by the error correction circuit. However, in a fourth program loop PL#4, a second column scan operation PL4S2 determines that the number of failed bits has fallen below the number of failed bits that can be corrected by the error correction circuit. Accordingly, the program operation terminates after the fourth program loop.

In contrast, in the conventional program operation illustrated in FIG. 4B, the program operation proceeds until a maximum number of program loops "Y" is reached even if the number of failed bits falls below the number that can be corrected by the error correcting circuit, as illustrated by the label "X-bit fail exists." Upon finishing Y program loops, the program operation terminates with a failure status and a corresponding memory block is classified as a bad block. Accordingly, the conventional method illustrated in FIG. 4B tends to take more time, and results in less efficient memory usage than the method illustrated in 4A.

The foregoing preferred embodiments are teaching examples. Those of ordinary skill in the art will understand that various changes in form and details may be made to the exemplary embodiments without departing from the scope of the present invention as defined by the following claims.

What is claimed is:

1. A method of performing a program operation of a non-volatile memory device, the method comprising:
    (a) programming selected memory cells of the non-volatile memory device;
    (b) reading data bits from the selected memory cells;
    (c) performing a first column scan operation by sequentially selecting predetermined sub-units of the data bits and determining whether any of the selected memory cells is inadequately programmed based on the selected sub-units;
    (d) upon determining that at least one of the selected memory cells is inadequately programmed and before selecting all of the predetermined sub-units of the data bits in the first column scan operation, performing a second column scan operation to detect a total number of the selected memory cells that are inadequately programmed;
    (e) upon determining that the total number of the selected memory cells that are inadequately programmed is less than a number that can be corrected by an error correcting circuit, terminating the program operation with a program pass status; and
    (f) terminating the second column scan operation upon determining that the total number of inadequately programmed memory cells is greater than the number that can be corrected by the error correcting circuit.

2. The method of claim 1, wherein the second column scan operation is only performed after a programming loop comprising (a), (b), and (c) has been repeated M times, where M is a reference value greater than or equal to two (2).

3. The method of claim 1, further comprising:
    repeating (a), (b) and (c) upon terminating the second column scan operation.

4. A method of programming a non-volatile memory device, the method comprising:
    (a) programming selected memory cells of the non-volatile memory device;
    (b) performing a verify read operation to read data bits from the selected memory cells after programming the selected memory cells;
    (c) performing a first column scan operation after performing the verify read operation to determine whether any of the selected memory cells is inadequately programmed;
    (d) upon determining that at least one of the selected memory cells is inadequately programmed, performing a second column scan operation to determine a total number of the selected memory cells that are inadequately programmed, wherein performing the second column scan operation comprises sequentially selecting predetermined sub-units of the data bits beginning with a last sub-unit selected in the first column scan operation; and,
    (e) upon determining that the total number of the selected memory cells that are inadequately programmed is less than a number that can be corrected by an error correcting circuit, terminating the program operation with a program pass status.

5. The method of claim 4, wherein performing the first column scan operation comprises sequentially selecting predetermined sub-units of the data bits and determining whether any of the data bits is inadequately programmed based on the selected sub-units.

6. The method of claim 4, wherein performing the second column scan operation comprises sequentially selecting predetermined sub-units of the data bits and counting the total number of memory cells among the selected memory cells that are inadequately programmed from the selected sub-units.

7. The method of claim 4, wherein the second column scan operation is only performed after a programming loop comprising (a), (b), and (c) has been repeated M times, where M is a reference value greater than or equal to two (2).

8. The method of claim 7, wherein M equals 2 or 3.

9. A non-volatile memory device comprising:
    a memory cell array comprising a plurality of non-volatile memory cells arranged in rows and columns;
    a page buffer circuit reading and storing data bits from a selected row of the memory cells during a verify read operation of a program operation;
    a column selection circuit selecting predetermined units of the data bits from the page buffer circuit in response to a column address;
    a pass/fail check circuit determining whether or not all of the memory cells in the selected row are adequately programmed based on the predetermined units of data bits selected by the column selection circuit in a first column scan operation;
    a fail bit counter counting a total number of memory cells in the selected row that are inadequately programmed in a second column scan operation; and,
    a control logic circuit activating the fail bit counter such that the second column scan operation is performed when at least one data bit selected by the column selection circuit in the first column scan operation indicates that a corresponding memory cell in the selected row is inadequately programmed;
    wherein the control logic circuit terminates the program operation with a program pass status when the total number of inadequately programmed memory cells in the selected row, as determined by the second column scan operation, is less than a number that can be corrected by an error correcting circuit, and the control logic circuit terminates the second column scan operation when the total number of inadequately programmed memory cells counted in the second column scan operation is greater than the number that can be corrected by the error correcting circuit.

10. The non-volatile memory device of claim 9, wherein the control logic circuit activates the fail bit counter when at least one of the data bits selected by the column selection circuit indicates that a corresponding one of the selected memory cells is inadequately programmed in the first column scan operation.

11. The non-volatile memory device of claim 9, further comprising:
    a first address generation circuit controlled by the control logic circuit to sequentially generate first column addresses to be applied to the column selection circuit during the first column scan operation; and, a second address generation circuit controlled by the control logic circuit to sequentially generate second column addresses to be applied to the column selection circuit in the second column scan operation, wherein the second column addresses are generated based on a start address generated by the first column generation circuit during the first column scan operation.

12. The non-volatile memory device of claim 9, wherein the second column scan operation is performed after two or three program loops are performed on the selected memory cells.

13. The non-volatile memory device of claim 9, wherein the control logic circuit performs a next program loop on the selected memory cells upon termination of the second column scan operation.

14. The non-volatile memory device of claim 9, further comprising:
   a loop counter circuit controlled by the control logic circuit to count a number of program loops performed on the selected memory cells; and,
   a program circuit storing a maximum program loop number;
   wherein the maximum program loop number stored in the program circuit is supplied to the control logic circuit.

15. The non-volatile memory device of claim 14, wherein the program circuit is programmed such that the maximum program loop number can be varied.

16. The non-volatile memory device of claim 14, wherein the control logic circuit terminates the program operation when the program loop number provided by the loop counter circuit reaches the maximum program loop number.

17. A method of performing a program operation of a non-volatile memory device, the method comprising:
   (a) programming selected memory cells of the non-volatile memory device;
   (b) reading data bits from the selected memory cells;
   (c) performing a first column scan operation by sequentially selecting predetermined sub-units of the data bits and determining whether any of the selected memory cells is inadequately programmed based on the selected sub-units;
   (d) upon determining that at least one of the selected memory cells is inadequately programmed, performing a second column scan operation to determine a total number of the selected memory cells that are inadequately programmed, wherein performing the second column scan operation comprises sequentially selecting predetermined sub-units of the data bits beginning with a last sub-unit selected in the first column scan operation; and
   (e) upon determining that the total number of the selected memory cells that are inadequately programmed is less than a number that can be corrected by an error correcting circuit, terminating the program operation with a program pass status.

18. A method of programming a non-volatile memory device, the method comprising:
   (a) programming selected memory cells of the non-volatile memory device;
   (b) performing a verify read operation to read data bits from the selected memory cells after programming the selected memory cells;
   (c) performing a first column scan operation after performing the verify read operation to determine whether any of the selected memory cells is inadequately programmed;
   (d) upon determining that at least one of the selected memory cells is inadequately programmed, performing a second column scan operation to determine a total number of the selected memory cells that are inadequately programmed;
   (e) upon determining that the total number of the selected memory cells that are inadequately programmed is less than a number that can be corrected by an error correcting circuit, terminating the program operation with a program pass status; and
   (f) upon determining that the total number of inadequately programmed memory cells is greater than the number that can be corrected by the error correcting circuit, terminating the second column scan operation.

19. The method of claim 18, wherein a program loop comprising (a), (b), (c), and (d) is repeated after terminating the second column scan operation.

* * * * *